(12) United States Patent
Jia

(10) Patent No.: US 11,641,725 B2
(45) Date of Patent: *May 2, 2023

(54) HEAT DISSIPATOR AND COMMUNICATIONS DEVICE

(71) Applicant: HUAWEI TECHNOLOGIES CO., LTD., Guangdong (CN)

(72) Inventor: Hui Jia, Dongguan (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/708,657

(22) Filed: Mar. 30, 2022

(65) Prior Publication Data

US 2022/0225532 A1 Jul. 14, 2022

Related U.S. Application Data

(63) Continuation of application No. 16/685,019, filed on Nov. 15, 2019, now Pat. No. 11,310,935, which is a (Continued)

(30) Foreign Application Priority Data

May 17, 2017 (CN) .......................... 201710349131.4

(51) Int. Cl.
*H05K 7/20* (2006.01)
*F28F 3/02* (2006.01)

(52) U.S. Cl.
CPC ......... *H05K 7/20154* (2013.01); *F28F 3/022* (2013.01); *H05K 7/20409* (2013.01)

(58) Field of Classification Search
CPC ............... H01L 23/473; H01L 23/4735; H01L 23/36; H01L 23/367; H01L 23/40; F28F 3/12;
(Continued)

(56) References Cited

U.S. PATENT DOCUMENTS 5,023,695 A 6/1991 Umezawa et al.
5,365,400 A 11/1994 Ashiwake et al.
(Continued)

FOREIGN PATENT DOCUMENTS

CN 1968596 A 5/2007
CN 101001516 A 7/2007
(Continued)

OTHER PUBLICATIONS

International Search Report for PCT/CN2018/081169 dated Jul. 4, 2018, 6 pages.

*Primary Examiner* — Michael A Matey

(57) ABSTRACT

Embodiments of this application relate to a heat dissipator including a cover plate, an orifice plate, and a base plate that are stacked in sequence. A distribution cavity is disposed between the orifice plate and the cover plate, a heat exchange cavity is disposed between the orifice plate and the base plate, and the distribution cavity communicates with the heat exchange cavity by using through holes disposed on the orifice plate. A plurality of pin fins facing the orifice plate are disposed on a surface of the base plate in the heat exchange cavity, gaps between the plurality of pin fins constitute a fluid passage, and the pin fins include a combination pin fin in contact with the orifice plate, and a flow guiding pin fin that corresponds to the through hole and that has a gap with the through hole.

20 Claims, 5 Drawing Sheets

Related U.S. Application Data continuation of application No. PCT/CN2018/081169, filed on Mar. 29, 2018.

(58) Field of Classification Search
CPC .......... F28F 3/02; F28F 2260/02; F28F 13/08; F28F 13/185; F28F 2215/10; F28F 3/048; F28F 3/06; F28F 3/086; H05K 7/20254; H05K 7/20927; H05K 7/20263; H05K 1/0201; H05K 7/20; H05K 7/20154; H05K 7/20218; H05K 7/20281; H05K 7/2039; H05K 7/20409; G06F 1/20; G06F 2200/201

See application file for complete search history.

(56) References Cited

U.S. PATENT DOCUMENTS

| | | |
|---|---|---|
| 6,131,650 A | 10/2000 | North et al. |
| 6,431,260 B1 | 8/2002 | Agonafer et al. |
| 7,353,859 B2 | 4/2008 | Stevanovic et al. |
| 7,762,314 B2 | 7/2010 | Campbell et al. |
| 7,836,597 B2 | 11/2010 | Datta et al. |
| 9,642,287 B2 | 5/2017 | Kikuchi et al. |
| 2004/0150956 A1 | 8/2004 | Conte |
| 2005/0092007 A1 | 5/2005 | Gutfeld et al. |
| 2006/0108098 A1 | 5/2006 | Stevanovic et al. |
| 2007/0119565 A1 | 5/2007 | Brunschwiler et al. |
| 2007/0215325 A1 | 9/2007 | Solovitz et al. |
| 2014/0158324 A1 | 6/2014 | Tochiyama et al. |
| 2014/0190669 A1 | 7/2014 | Hoshino et al. |
| 2015/0348869 A1 | 12/2015 | Joshi et al. |
| 2017/0045300 A1 | 2/2017 | Boday et al. |
| 2017/0271240 A1 | 9/2017 | Inoue et al. |
| 2019/0181717 A1 | 6/2019 | Zhou et al. |
| 2019/0360759 A1 | 11/2019 | Collins et al. |
| 2020/0187385 A1 | 6/2020 | Olesen et al. |
| 2020/0227341 A1 | 7/2020 | Neal et al. |
| 2020/0258815 A1 | 8/2020 | Suzuki et al. |

FOREIGN PATENT DOCUMENTS

| | | |
|---|---|---|
| CN | 101103659 A | 1/2008 |
| CN | 201226636 Y | 4/2009 |
| CN | 102014598 A | 4/2011 |
| CN | 202149467 U | 2/2012 |
| CN | 105609475 A | 5/2016 |
| CN | 106550588 A | 3/2017 |
| WO | 2017059382 A1 | 4/2017 |

HEAT DISSIPATOR AND COMMUNICATIONS DEVICE

CROSS-REFERENCE TO RELATED APPLICATIONS

This application is a continuation of U.S. patent application Ser. No. 16/685,019, filed on Nov. 15, 2019, which is a continuation of International Application No. PCT/CN2018/081169, filed on Mar. 29, 2018, which claims priority to Chinese Patent Application No. 201710349131.4, filed on May 17, 2017. All of the aforementioned patent applications are hereby incorporated by reference in their entireties.

TECHNICAL FIELD

This application relates to a heat dissipation apparatus, and in particular, to a heat dissipator and a communications device.

BACKGROUND

With continuous increasing of power of a heat emitting apparatus (for example, a chip) in a communications device, the heat emitting apparatus generates an increasing amount of heat in a running process. Therefore, an increasingly strict requirement is posed on a heat dissipator configured to perform heat dissipation on the heat emitting apparatus. Currently, a heat dissipator can be mainly classified into a micro channel heat dissipator and a jet flow heat dissipator that combines a jet flow technology and a micro channel.

However, heat dissipation efficiency of the heat dissipator is relatively low because of a structure of the heat dissipator. Therefore, how to improve heat dissipation efficiency of the jet flow heat dissipator is a problem that urgently needs to be resolved currently.

SUMMARY

Embodiments of this application provide a heat dissipator and a communications device, so as to improve heat dissipation efficiency of the heat dissipator.

To achieve the foregoing objective, the following technical solutions are used in the embodiments of this application.

According to a first aspect, a heat dissipator is disclosed. The heat dissipator includes a cover plate, an orifice plate, and a base plate that are stacked in sequence. A distribution cavity is disposed between the orifice plate and the cover plate, a heat exchange cavity is disposed between the orifice plate and the base plate, and through holes are disposed on the orifice plate, so that the distribution cavity communicates with the heat exchange cavity by using the through holes. A plurality of pin fins facing the orifice plate are disposed on a surface of the base plate in the heat exchange cavity, gaps between the plurality of pin fins constitute a fluid passage, and the pin fins include a combination pin fin and a flow guiding pin fin. The combination pin fin is in contact with the orifice plate, and the flow guiding pin fin corresponds to the through hole and has a gap with the through hole.

In the heat dissipator provided in this embodiment of this application, there is the gap between the flow guiding pin fin and the through hole of the orifice plate, and the combination pin fin is separately in contact with the base plate and the orifice plate. Therefore, when heat dissipation is performed on the heat dissipator, after being jetted into the gap between the flow guiding pin fin and the through hole, a fluid whose temperature is less than a temperature of a heat emitting apparatus enters a fluid passage constituted by the combination pin fin and the flow guiding pin fin, to participate in heat exchanging. In this way, a quantity of fluids that directly flow out of the heat exchange cavity without passing through the fluid passage constituted by the combination pin fin and the flow guiding pin fin is reduced, and fluid utilization is increased. Therefore, the heat dissipator provided in this embodiment of this application can improve heat dissipation efficiency of the heat dissipator.

It should be noted that, to prevent the through hole from being blocked, the flow guiding pin fin may alternatively not be disposed on the surface of the base plate in the heat exchange cavity. In other words, the pin fins can include the combination pin fin being in contact with the orifice plate.

In a possible design, the gap between the flow guiding pin fin and the through hole is greater than or equal to 0.1 mm. In other words, a difference between a height of the combination pin fin and a height of the flow guiding pin fin is greater than or equal to 0.1 mm. In this way, at a location corresponding to the through hole, sufficient space may be reserved for a fluid to enter the heat exchange cavity, so that the fluid can be smoothly jetted into the fluid passage constituted by the combination pin fin and the flow guiding pin fin. In addition, after the fluid passes by a distance greater than or equal to 0.1 mm, a speed of the fluid may be relatively slowed down, so as to reduce impact on the flow guiding pin fin, and avoid abrasion of the flow guiding pin fin that is caused by long-term impact of a high-speed fluid.

In a possible design, an elastic gasket may be disposed between the combination pin fin and the orifice plate, so that the combination pin fin is in contact with the orifice plate by using the elastic gasket. After the heat dissipator is manufactured, the elastic gasket elastically deforms under pressure of the combination pin fin and the orifice plate, so that the elastic gasket is separately in close contact with the combination pin fin and the orifice plate, thereby compensating for deficiency that the combination pin fin is not in contact with the orifice plate because of impact of processing precision.

In a possible design, a shape of a cross section of each combination pin fin is a square, a circle, or a rhombus.

In a possible design, a shape of a cross section of each flow guiding pin fin may also be a square, a circle, or a rhombus.

The square, the circle, or the rhombus is symmetrical, so as to help design and process the heat dissipator, and help implement industrialized production of the heat dissipator. However, these examples are of course non-limiting and the shape of the cross section of each combination pin fin and/or each flow guiding pin fin may include any shape.

In a possible design, a feature size of each combination pin fin is less than or equal to 1 mm, and the feature size=4×an area of a cross section of the combination pin fin/a perimeter of the cross section of the combination pin fin.

In a possible design, a ratio of a height to the feature size of each combination pin fin is greater than or equal to 5.

In a possible design, a ratio of a gap between two adjacent combination pin fins to each of feature sizes of the combination pin fins ranges from 1:0.9 to 1:1.1.

In a possible design, a feature size of each flow guiding pin fin is less than or equal to 1 mm, and the feature size=4×an area of a cross section of the flow guiding pin fin/a perimeter of the cross section of the flow guiding pin fin.

In a possible design, a ratio of a height to the feature size of each flow guiding pin fin is greater than or equal to 5.

In a possible design, a ratio of a gap between two adjacent flow guiding pin fins to each of feature sizes of the combination pin fins ranges from 1:0.9 to 1:1.1.

Because a size and distribution density of the combination pin fin and those of the flow guiding pin fin fall within the foregoing value range, a quantity of combination pin fins and a quantity of flow guiding pin fins per unit volume may be increased while it is ensured that a fluid can smoothly flow, so as to increase a contact area between the fluid and the combination pin fin and a contact area between the fluid and the flow guiding pin fin, and further increase heat dissipation efficiency of the heat dissipator.

It should be noted that a feature size is four times of a ratio of an area of a cross section of a pin fin to a perimeter of the cross section of the pin fin. For example, when a shape of the cross section of the pin fin (e.g., the combination pin fin and/or the flow guiding pin fin) is a circle, a feature size of the pin fin=$4\pi R^2/2\pi R=2R$. In other words, the feature size of the circle is a diameter D of the circle, R is a radius of the circle, and D is the diameter of the circle. When a shape of the cross section of the pin fin (e.g., the combination pin fin and/or the flow guiding pin fin) is a rectangle, a feature size of the rectangle=$4AB/2(A+B)$, where A is a width of the rectangle, and B is a length of the rectangle.

In a possible design, the base plate, the combination pin fin, and the flow guiding pin fin may be made of aluminum alloy, brass, or red copper by using an integrated forming technology. In a case of same fluid utilization, a higher heat dissipation coefficient of a material of which the base plate, the combination pin fin, or the flow guiding pin fin is made leads to higher heat dissipation efficiency of the heat dissipator. Therefore, when the base plate, the combination pin fin, and the flow guiding pin fin are made of aluminum alloy, brass, or red copper having a relatively high heat dissipation coefficient, heat dissipation efficiency of the heat dissipator can be further improved In a possible design, a diameter of the through hole ranges from 0.2 mm to 2.0 mm. In this way, a high-speed jetting stream can be formed after a fluid flows through the through hole, so as to increase a quantity of fluids that are jetted into the bottom of the fluid passage, properly reduce working pressure of the distribution cavity, and improve security of the heat dissipator.

In a possible design, the heat dissipator may be classified into a single-phase heat dissipator and a phase-change heat dissipator based on a heat dissipation manner. No phase change occurs on a fluid (which is always in a liquid state) of the single-phase heat dissipator in a heat exchange process, and a phase change occurs on a heat dissipation fluid (which is gasified from a liquid state to a gas state) of the phase-change heat dissipator in a heat exchange process.

Alternatively, the heat dissipator may be classified into a distributed heat dissipator and a single-pass heat dissipator based on a flow manner of a fluid.

In a possible design, when the heat dissipator is the distributed heat dissipator, partition plates that face the cover plate and that are in contact with the cover plate are disposed on a surface of the orifice plate in the distribution cavity of the heat dissipator, the partition plates partition the distribution cavity into a plurality of inflow cavities and a plurality of outflow cavities, and the inflow cavities and the outflow cavities separately communicate with the heat exchange cavity by using the through holes; and the inflow cavities are provided with a fluid inlet, and the outflow cavities are provided with a fluid outlet. After the fluid is jetted from one inflow cavity into the heat exchange cavity by using the through hole for heat exchanging, the fluid flows from the heat exchange cavity to an outflow cavity adjacent to the inflow cavity by using the through hole, so as to shorten a path through which the fluid flows in the fluid passage constituted by the combination pin fin and the flow guiding pin fin. This is especially applied to the phase-change heat dissipator, and the distributed heat dissipator can reduce a possibility that the heat exchange cavity is dried out. In addition, because there are a plurality of outflow cavities, there are also a plurality of through holes communicating with the outflow cavities, so that a fluid obtained after the heat exchanging can flow into the outflow cavities by using the plurality of through holes, thereby reducing internal pressure of the heat exchange cavity.

In a possible design, the partition plates may be in a sawtooth shape or a spiral shape. Correspondingly, the partition plates partition the distribution cavity into a plurality of sawtooth inflow cavities and a plurality of sawtooth outflow cavities, or partition the distribution cavity into a plurality of spiral inflow cavities and a plurality of spiral outflow cavities. Compared with the spiral partition plate, the sawtooth partition plate has a simple structure, and pressure of the inflow cavities is evenly distributed, so that a heat dissipator having a sawtooth partition plate is more practical.

In a possible design, the inflow cavities and the outflow cavities are alternately distributed. In this way, a path through which a fluid flows in the fluid passage constituted by the combination pin fin and the flow guiding pin fin can be further shortened.

In a possible design, a diameter of a through hole communicating with the inflow cavity is less than a diameter of a through hole communicating with the outflow cavity. A through hole that has a smaller diameter and that communicates with the inflow cavity may increase a fluid speed when a fluid is jetted into the heat exchange cavity, so that the fluid can be jetted into the bottom of the heat exchange cavity by using a gap between flow guiding pin fins. A through hole that has a larger diameter and that communicates with the outflow cavity helps a fluid obtained after heat exchanging to be discharged from the heat exchange cavity, so as to reduce internal pressure of the heat exchange cavity.

In a possible design, diameters of through holes communicating with the outflow cavities gradually increase in a direction from approaching the fluid inlet to away from the fluid inlet. This is because a quantity of fluids obtained after heat exchanging gradually increases in the heat exchange cavity in the direction from approaching the fluid inlet to away from the fluid inlet, and the diameters of the through holes communicating with the outflow cavities gradually increase, so as to better help the fluids obtained after the heat exchanging to be discharged from the heat exchange cavity, and further reduce internal pressure of the heat exchange cavity.

In a possible design, a height of a flow guiding pin fin corresponding to the inflow cavity is greater than a height of a flow guiding pin fin corresponding to the outflow cavity. In this way, this better helps fluids obtained after heat exchanging aggregate at a location of a through hole communicating with the outflow cavity, so as to help the fluids obtained after the heat exchanging to be discharged from the heat exchange cavity, and further reduce internal pressure of the heat exchange cavity.

In a possible design, when the heat dissipator is the single-pass heat dissipator, a distribution cavity of the heat dissipator is provided with a fluid inlet, and a heat exchange cavity of the heat dissipator is provided with a fluid outlet. The single-pass heat dissipator has a simple structure, and implements regular flow of a fluid.

In a possible design, diameters of through holes gradually decrease in a direction from approaching the fluid inlet to away from the fluid inlet. This is because a quantity of fluids obtained after heat exchanging gradually increases in the heat exchange cavity in the direction from approaching the fluid inlet to away from the fluid inlet, and the diameters of the through holes gradually decrease, so that the fluids obtained after the heat exchanging can be prevented from reversely overflowing to the distribution cavity by using the through holes.

According to a second aspect, a communications device is disclosed. The communications device includes a heat emitting apparatus and the heat dissipator in the foregoing embodiment, and a base plate of the heat dissipator is in contact with the heat emitting apparatus.

In the heat dissipator in the communications device provided in this embodiment of this application, there is the gap between the flow guiding pin fin and the through hole of the orifice plate, and the combination pin fin is separately in contact with the base plate and the orifice plate. Therefore, when heat dissipation is performed on the heat dissipator, after being jetted into the gap between the flow guiding pin fin and the through hole, a fluid whose temperature is less than a temperature of a heat emitting apparatus enters a fluid passage constituted by the combination pin fin and the flow guiding pin fin, to participate in heat exchanging. In this way, a quantity of fluids that directly flow out of the heat exchange cavity without passing through the fluid passage constituted by the combination pin fin and the flow guiding pin fin is reduced, and fluid utilization is increased. Therefore, the communications device provided in this embodiment of this application can improve heat dissipation efficiency of the communications device.

DESCRIPTION OF EMBODIMENTS

Figure 1:
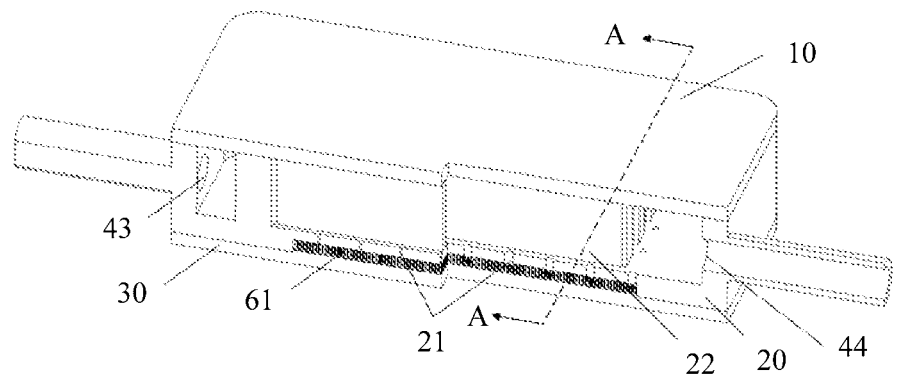
FIG. 1 is a schematic structural diagram of a heat dissipator according to an embodiment of this application.

The following clearly describes the technical solutions in the embodiments of this application with reference to the accompanying drawings in the embodiments of this application.

An embodiment of this application provides a heat dissipator. Referring to FIG. 1 to FIG. 8, the heat dissipator includes a cover plate 10, an orifice plate 20, and a base plate 30 that are stacked in sequence. A distribution cavity 40 is disposed between the cover plate 10 and the orifice plate 20, and a heat exchange cavity 50 is disposed between the orifice plate 20 and the base plate 30. Through holes 21 through which the distribution cavity 40 communicates with the heat exchange cavity 50 are disposed on the orifice plate 20. A plurality of pin fins 61 facing the orifice plate 20 are disposed on a surface of the base plate 30 in the heat exchange cavity 50, and gaps between the plurality of pin fins 61 constitute a fluid passage. As shown in FIG. 3, the pin fins 61 include a combination pin fin 62 in contact with the orifice plate 20, and a flow guiding pin fin 63 that corresponds to the through hole 21 and that has a gap with the through hole 21.

Figure 2:
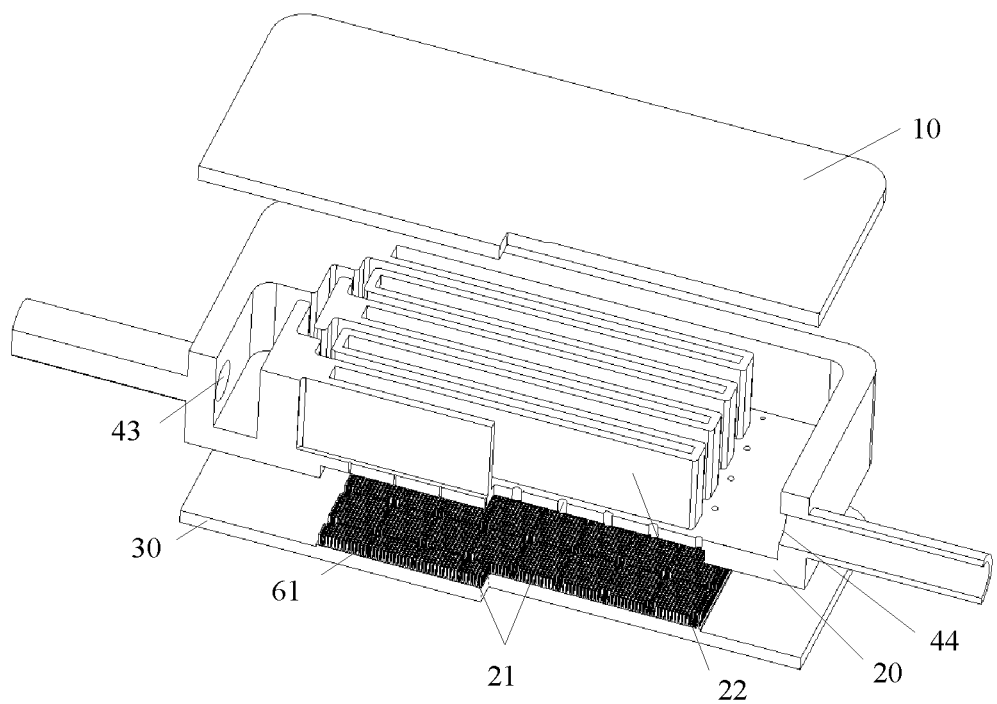
FIG. 2 is an exploded diagram of FIG. 1.
Figure 3:
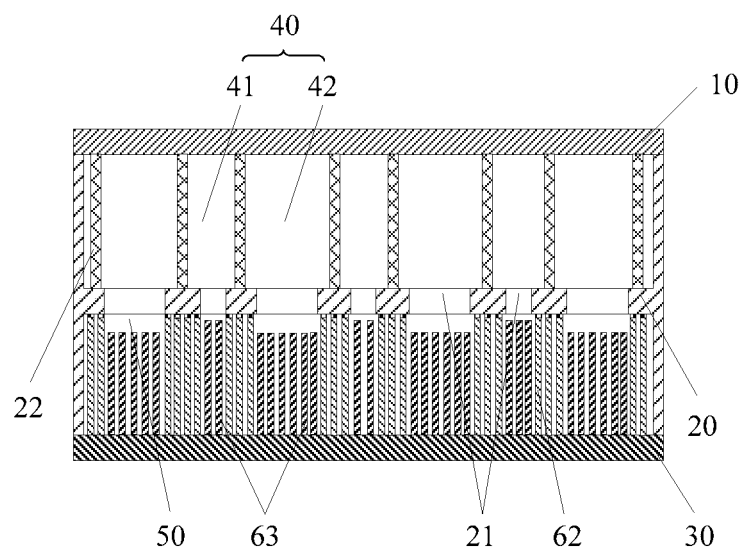
FIG. 3 is a sectional view of FIG. 1 in an A-A direction.

To form the distribution cavity 40 and the heat exchange cavity 50, for example, as shown in FIG. 1 to FIG. 3, grooves are respectively disposed on an upper surface and a lower surface of the orifice plate 20. After the cover plate 10, the orifice plate 20, and the base plate 30 are stacked and welded together, the cover plate 10 and the base plate 30 respectively seal openings of the upper and lower grooves (disposed on the upper surface and the lower surface of the orifice plate 20), so that space in the groove on the upper surface of the orifice plate 20 can be used as the distribution cavity 40, and space in the groove on the lower surface of the orifice plate 20 can be used as the heat exchange cavity 50.

In the heat dissipator provided in this embodiment of this application, there is the gap between the flow guiding pin fin 63 and the through hole 21 of the orifice plate 20, and the combination pin fin 62 is separately in contact with the base plate 30 and the orifice plate 20. Therefore, when heat dissipation is performed on the heat dissipator, after being jetted into the gap between the flow guiding pin fin 63 and the through hole 21, a fluid, whose temperature is less than a temperature of a heat emitting apparatus, enters a fluid passage constituted by the combination pin fin 62 and the flow guiding pin fin 63, to participate in heat exchanging. In this way, a quantity of fluids that directly flows out of the heat exchange cavity 50 without passing through the fluid passage constituted by the combination pin fin 62 and the flow guiding pin fin 63 is reduced, and fluid utilization is increased. Therefore, compared with the prior art, the heat dissipator provided in this embodiment of this application can improve heat dissipation efficiency of the heat dissipator.

It should be noted that, to prevent the through hole 21 from being blocked, the flow guiding pin fin 63 may alternatively not be disposed on the surface of the base plate 30 in the heat exchange cavity 50. In other words, the pin fins 61 include the combination pin fins 62 in contact with the orifice plate 20.

In the heat dissipator, there are a plurality of through holes 21, a plurality of combination pin fins 62, and a plurality of flow guiding pin fins 63. It should be noted herein that, although there are a plurality of through holes 21 and a plurality of flow guiding pin fins 63, it does not mean that the through holes 21 are in a one-to-one correspondence with the flow guiding pin fins 63. In other words, one through hole 21 may correspond to one flow guiding pin fin 63, or may correspond to a plurality of flow guiding pin fins 63. Of course, there examples are not limited herein. It should be further noted that, because a diameter of the through hole 21 is usually greater than a diameter of the flow guiding pin fin 63, one flow guiding pin fin 63 usually does not correspond to a plurality of through holes 21.

To enable a fluid to be smoothly jetted into the heat exchange cavity 50, the gap between the flow guiding pin fin 63 and the through hole 21 needs to be greater than or equal to 0.1 mm. For example, the gap between the flow guiding pin fin 63 and the through hole 21 ranges from 0.5 mm to 2.0 mm. In other words, a difference between a height of the combination pin fin 62 and a height of the flow guiding pin fin 63 needs to be greater than or equal to 0.1 mm. In this way, at a location corresponding to the through hole 21, sufficient space may be reserved for a fluid to enter the heat exchange cavity 50, so that the fluid can be smoothly jetted into the fluid passage constituted by the combination pin fin 62 and the flow guiding pin fin 63. In addition, after the fluid passes by a distance greater than or equal to 0.1 mm, a speed of the fluid may be relatively slowed down, so as to reduce impact on the flow guiding pin fin 63, and avoid abrasion of the flow guiding pin fin 63 that is caused by long-term impact of a high-speed fluid.

In a process of manufacturing the heat dissipator, the combination pin fin 62 may not be in contact with the orifice plate 20 because of impact of actual processing precision, and consequently a gap between the combination pin fin 62 and the orifice plate 20 is caused. To avoid such a problem, referring to FIG. 5, an elastic gasket 64 may be disposed between the combination pin fin 62 and the orifice plate 20, so that the combination pin fin 62 is in contact with the orifice plate 20 by using the elastic gasket 64. After the heat dissipator is processed based on a design size, the elastic gasket 64 elastically deforms under pressure of the combination pin fin 62 and the orifice plate 20, so that the elastic gasket 64 is separately in close contact with the combination pin fin 62 and the orifice plate 20, thereby compensating for a deficiency that the combination pin fin 62 is not in contact with the orifice plate 20 because of impact of processing precision, further reducing a quantity of fluids that do not pass through the fluid passage but directly flow out of the heat exchange cavity 50, and increasing fluid utilization and improving heat dissipation efficiency of the heat dissipator.

To form the elastic gasket 64, for example, the elastic gasket 64 may be pasted on a surface of the combination pin fin 62 or the orifice plate 20 by using a binding agent. Certainly, the elastic gasket 64 may alternatively be formed on a surface of the combination pin fin 62 or the orifice plate 20 by using a fluid-like elastic fluid material through dispensing and curing, among other aspects.

After the structure of the heat dissipator is understood, the following describes in detail optional parameters of the combination pin fin 62, the flow guiding pin fin 63, and the through hole 21 in the heat dissipator.

For a shape of the combination pin fin 62 and a shape of the flow guiding pin fin 63, a shape of a cross section of each combination pin fin 62 may be a square, a circle, or a rhombus, for example. Likewise, a shape of a cross section of each flow guiding pin fin 63 may also be a square, a circle, or a rhombus, for example. The cross section is a section perpendicular to an axis direction of the combination pin fin 62 or the flow guiding pin fin 63. These shapes are all symmetrical, so as to help design and process the heat dissipator, and help implement industrialized production of the heat dissipator.

There may be a plurality of combination manners of the shape of the cross section of the combination pin fin 62 and the shape of the cross section of the flow guiding pin fin 63. For example, the cross section of the combination pin fin 62 may be in a square shape, and the cross section of the flow guiding pin fin 63 may also be in a square shape. Alternatively, the cross section of the combination pin fin 62 is in a rhombus shape, and the cross section of the flow guiding pin fin 63 is in a square shape. Both the combinations are allowed. However, likewise, considering processing and design convenience and industrialized production, the shape of the cross section of the combination pin fin 62 is the same as the shape of the cross section of the flow guiding pin fin 63.

For a size and distribution density of the combination pin fins 62 and those of the flow guiding pin fins 63, a feature size of each combination pin fin 62 is less than or equal to 1 mm, a ratio of a height to the feature size of each combination pin fin 62 is greater than or equal to 5, and a ratio of a gap between two adjacent combination pin fins 62 to each of feature sizes of the combination pin fins ranges from 1:0.9 to 1:1.1; likewise, a feature size of each flow guiding pin fin 63 is less than or equal to 1 mm, a ratio of a height to the feature size of each flow guiding pin fin 63 is greater than or equal to 5, and a ratio of a gap between two adjacent flow guiding pin fins 63 to each of feature sizes of the combination pin fins ranges from 1:0.9 to 1:1.1. Because the size and the distribution density of the combination pin fin 62 and those of the flow guiding pin fin 63 fall within the foregoing value range, a quantity of combination pin fins 62 and a quantity of flow guiding pin fins 63 per unit volume may be increased while it is ensured that a fluid can smoothly flow, so as to increase a contact area between the fluid and the combination pin fin 62 and a contact area between the fluid and the flow guiding pin fin 63, and further increase heat dissipation efficiency of the heat dissipator.

It should be noted that a feature size is four times of a ratio of an area of a cross section of a pin fin to a perimeter of the cross section of the pin fin. For example, when a shape of the cross section of the pin fin (the combination pin fin 62 and/or the flow guiding pin fin 63) is a circle, a feature size of the pin fin=$4\pi R^2/2\pi R=2R$. In other words, the feature size of the circle is a diameter D of the circle, R is a radius of the circle, and D is the diameter of the circle. When a shape of the cross section of the pin fin is a rectangle, a feature size of the rectangle=$4AB/2(A+B)$, where A is a width of the rectangle, and B is a length of the rectangle.

In addition to fluid utilization, a heat exchange coefficient of a material of which the heat dissipator is made is also one of important factors that affect heat dissipation efficiency of the heat dissipator. Therefore, for a material of which the base plate 30, the combination pin fin 62, or the flow guiding pin fin 63 is made, any one of aluminum alloy, brass, or red copper having a relatively high heat exchange coefficient may be selected. Red copper ranks first and brass ranks second in terms of a heat exchange coefficient. A material of which the combination pin fin 62 is made may be the same as or may be different from a material of which the flow guiding pin fin 63 is made. However, for ease of processing, the base plate 30, the combination pin fin 62, and the flow guiding pin fin 63 may be made of a same material by using an integrated forming technology.

A diameter of the through hole 21 may range from 0.2 mm to 2.0 mm. This is because if the diameter of the through hole 21 is excessively large (e.g., exceeds 2.0 mm), a jetting speed after a fluid passes through the through hole 21 is reduced, and consequently a jetting stream cannot be formed, the fluid cannot reach the bottom of the heat exchange cavity 50 for exchanging, and heat exchange efficiency is reduced. If the diameter is excessively small (e.g., less than 0.2 mm), a fluid requires very high pressure to pass through the through hole 21, and consequently working pressure of the distribution cavity 40 is increased. Therefore, it is set that the diameter of the through hole 21 ranges from 0.2 mm to 2.0 mm, so that a high-speed jetting stream can be formed after the fluid flows through the through hole 21, thereby increasing a quantity of fluids that are jetted into the bottom of the fluid passage, properly reducing working pressure of the distribution cavity 40, and improving security of the heat dissipator.

The heat dissipator provided in this embodiment of this application may be classified into a single-phase heat dissipator and a phase-change heat dissipator based on a heat dissipation manner. For the two heat dissipation manners, the structure of the heat dissipator does not need to be changed. A difference between the two heat dissipation manners lies in whether a state of a fluid changes in a heat dissipation process. Specifically, in a heat dissipation process, no phase change occurs on a fluid in a liquid state of the single-phase heat dissipator when the fluid performs heat exchanging with the combination pin fin 62, the flow guiding pin fin 63, and the base plate 30. In other words, the fluid can always be in a liquid state. However, in a heat dissipation process, a phase change occurs on a fluid in a liquid state of the phase-change heat dissipator when the fluid performs heat exchanging with the combination pin fin 62, the flow guiding pin fin 63, and the base plate 30. In other words, the fluid is gasified (or vaporized) to gas. Because a large amount of heat is absorbed in a fluid gasification process, heat dissipation efficiency of the phase-change heat dissipator is higher than that of the single-phase heat dissipator, and is more applicable to heat dissipation of a heat emitting apparatus with high power.

The heat dissipator provided in this embodiment of this application may be classified into a distributed heat dissipator and a single-pass heat dissipator based on a flow manner of a fluid. Thus, structures of the two heat dissipators can be different.

In the distributed heat dissipator, a flow manner of a fluid is as follows: The fluid flows in from the distribution cavity 40 and flows out of the distribution cavity 40. Referring to FIG. 1 to FIG. 5, partition plates 22 that face the cover plate 10 and that are in contact with the cover plate 10 are disposed on the surface of the orifice plate 20 in the distribution cavity 40, the partition plates 22 partition the distribution cavity 40 into a plurality of inflow cavities 41 and a plurality of outflow cavities 42, and the inflow cavities 41 and the outflow cavities 42 separately communicate with the heat exchange cavity 50 by using the through holes 21. The inflow cavities 41 are provided with a fluid inlet 43, and the outflow cavities 42 are provided with a fluid outlet 44.

A process in which heat dissipation is performed on the heat emitting apparatus by using the distributed heat dissipator is as follows: A fluid enters the inflow cavity 41 in the distribution cavity 40 from the fluid inlet 43, and under internal pressure of the distribution cavity 40, flows through the through hole 21 communicating with the inflow cavity 41 and then is jetted into the fluid passage constituted by the combination pin fin 62 and the flow guiding pin fin 63. The fluid performs heat exchanging with the combination pin fin 62, the flow guiding pin fin 63, and the base plate 30. Under internal pressure of the heat exchange cavity 50, the fluid obtained after the heat exchanging flows out of the heat exchange cavity 50 from the through hole 21 communicating with the outflow cavity 42 and then enters the outflow cavity 42, and flows out of the fluid outlet 44.

For the distributed heat dissipator, after the fluid is jetted from one inflow cavity 41 into the heat exchange cavity 50 by using the through hole 21 for heat exchanging, the fluid flows from the heat exchange cavity 50 to an outflow cavity 42 adjacent to the inflow cavity 41 by using the through hole 21, so as to shorten a path through which the fluid flows in the fluid passage constituted by the combination pin fin 62 and the flow guiding pin fin 63. This is especially applied to the phase-change heat dissipator, and the distributed heat dissipator can reduce a possibility that the heat exchange cavity is dried out. In addition, because there are a plurality of outflow cavities 42, there are also a plurality of through holes 21 communicating with the outflow cavities 42, so that a fluid obtained after the heat exchanging can flow into the outflow cavities 42 by using the plurality of through holes 21, thereby reducing internal pressure of the heat exchange cavity 50.

Figure 4A:
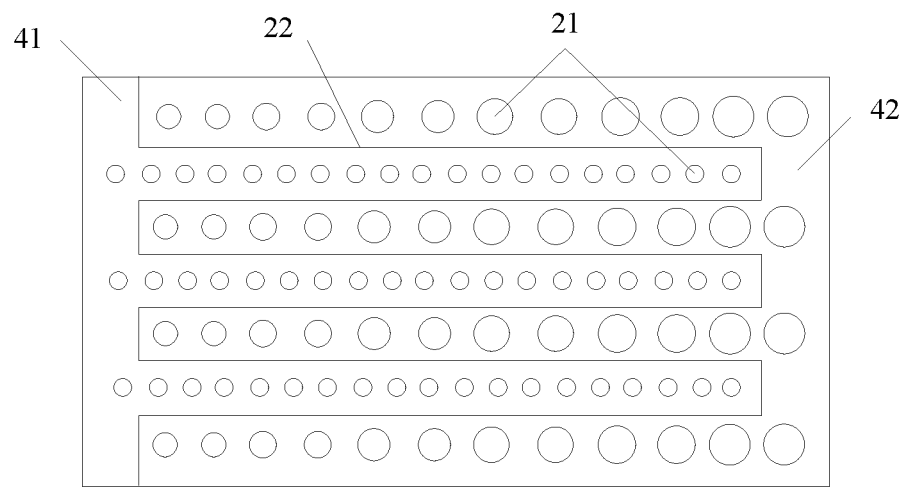
FIG. 4a is a schematic structural diagram of an orifice plate of a heat dissipator according to an embodiment of this application.
Figure 4B:
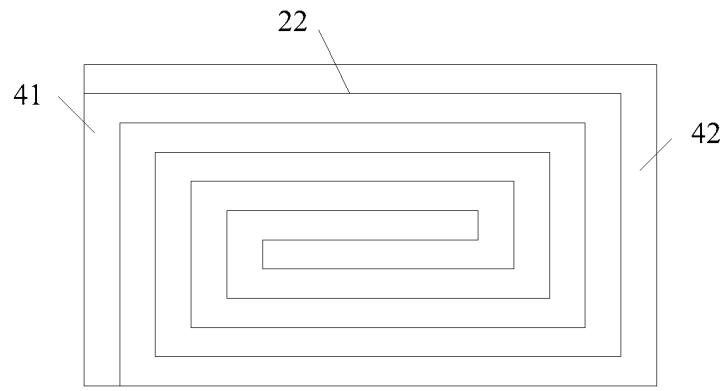
FIG. 4b is a schematic structural diagram in another form of an orifice plate of a heat dissipator according to an embodiment of this application, where through holes are omitted in this figure.
Figure 5:
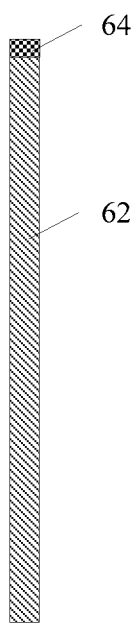
FIG. 5 is a schematic structural diagram of a combination pin fin of the heat dissipator in FIG. 1.

For example, the partition plates 22 may be in a sawtooth shape. As shown in FIG. 4a, the sawtooth partition plates 22 partition the distribution cavity 40 into a plurality of sawtooth inflow cavities 41 that communicate with each other and a plurality of sawtooth outflow cavities 42 that communicate with each other. Alternatively, the partition plates 22 may be in a spiral shape. As shown in FIG. 4b, the spiral partition plates 22 partition the distribution cavity 40 into a plurality of spiral inflow cavities 41 that communicate with each other and a plurality of spiral outflow cavities 42 that communicate with each other. Compared with the spiral partition plate 22, the sawtooth partition plate 22 has a simple structure, and pressure of the inflow cavities 41 is evenly distributed, so that a heat dissipator having a sawtooth partition plate 22 is more practical.

To further shorten the path through which the fluid flows in the fluid passage constituted by the combination pin fin 62 and the flow guiding pin fin 63, referring to FIG. 4a, it may be set that the inflow cavities 41 and the outflow cavities 42 are alternately distributed. In this way, the path through which the fluid flows in the fluid passage constituted by the combination pin fin 62 and the flow guiding pin fin 63 can be further shortened. Tests have shown that the setting may basically avoid a dry-out possibility.

As shown in FIG. 4a, a diameter of a through hole 21 communicating with the inflow cavity 41 is less than a diameter of a through hole 21 communicating with the outflow cavity 42. For example, the diameter of the through hole 21 communicating with the inflow cavity 41 may range from 0.2 mm to 0.5 mm, and the diameter of the through hole 21 communicating with the outflow cavity 42 may range from 1.5 mm to 2.0 mm. A through hole 21 that has a smaller diameter and that communicates with the inflow cavity 41 may increase a fluid speed when a fluid is jetted into the heat exchange cavity 50, so that the fluid can be jetted into the bottom of the heat exchange cavity 50 by using a gap between flow guiding pin fins 63. A through hole 21 that has a larger diameter and that communicates with the outflow cavity 42 helps a fluid obtained after heat exchanging to be discharged from the heat exchange cavity 50, so as to reduce internal pressure of the heat exchange cavity 50.

In the distributed heat dissipator, there is at least one fluid inlet 43, and the fluid inlet 43 may be disposed on a side surface of the inflow cavity 41. For example, it is assumed that the inflow cavity 41 includes a plurality of side surfaces. When there is one fluid inlet 43, the fluid inlet 43 is located on one side surface of the inflow cavity 41. However, when there are a plurality of fluid inlets 43, the plurality of fluid inlets 43 may be located on a same side surface of the inflow cavity 41, or may be located on different side surfaces of the inflow cavity 41.

Likewise, there is at least one fluid outlet 44, and the fluid outlet 44 may be disposed on a side surface of the outflow cavity 42. For example, it is assumed that the outflow cavity 42 includes a plurality of side surfaces. When there is one fluid outlet 44, the fluid outlet 44 is located on one side surface of the outflow cavity 42. However, when there are a plurality of fluid outlets 44, the plurality of fluid outlets 44 may be located on a same side surface of the outflow cavity 42, or may be located on different side surfaces of the outflow cavity 42.

When the fluid inlets 43 are located on the same side surface of the inflow cavity 41, to enable the fluid obtained after the heat exchanging to be more easily discharged from the heat exchange cavity 50, referring to FIG. 2 and FIG. 4a, diameters of through holes 21 communicating with the outflow cavities 42 gradually increase in a direction from approaching the fluid inlet 43 to away from the fluid inlet 43. This is because a quantity of fluids obtained after heat exchanging gradually increases in the heat exchange cavity 50 in the direction from approaching the fluid inlet 43 to away from the fluid inlet 43, and the diameters of the through holes 21 communicating with the outflow cavities 42 gradually increase, so as to help the fluids obtained after the heat exchanging to be discharged from the heat exchange cavity 50, and further reduce internal pressure of the heat exchange cavity 50.

Likewise, to further help fluids obtained after heat exchanging to be discharged, referring to FIG. 3, a height of a flow guiding pin fin 63 corresponding to the inflow cavity 41 may be greater than a height of a flow guiding pin fin 63 corresponding to the outflow cavity 42. In this way, this better helps the fluids obtained after the heat exchanging aggregate at a location of a through hole 21 communicating with the outflow cavity 42, so as to help the fluids obtained after the heat exchanging to be discharged from the heat exchange cavity 50, and further reduce internal pressure of the heat exchange cavity 50.

Figure 6:
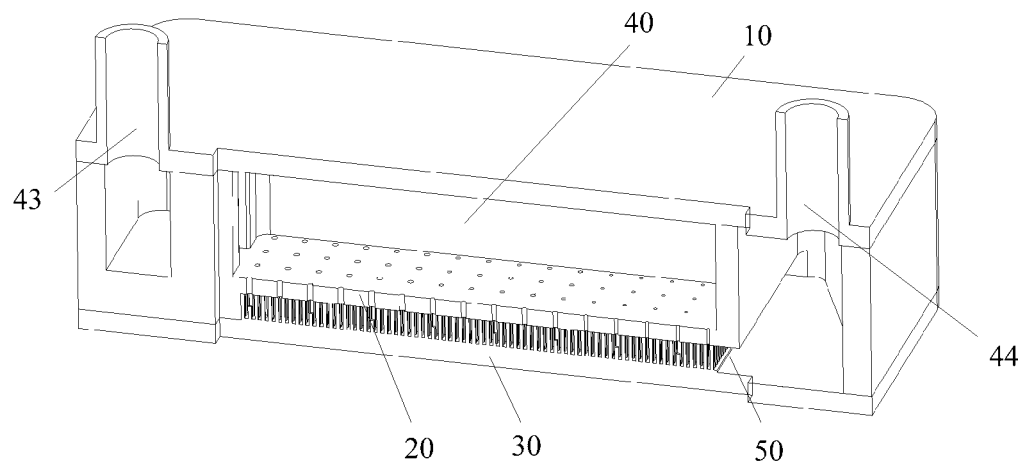
FIG. 6 is a schematic structural diagram in another form of a heat dissipator according to an embodiment of this application.
Figure 7:
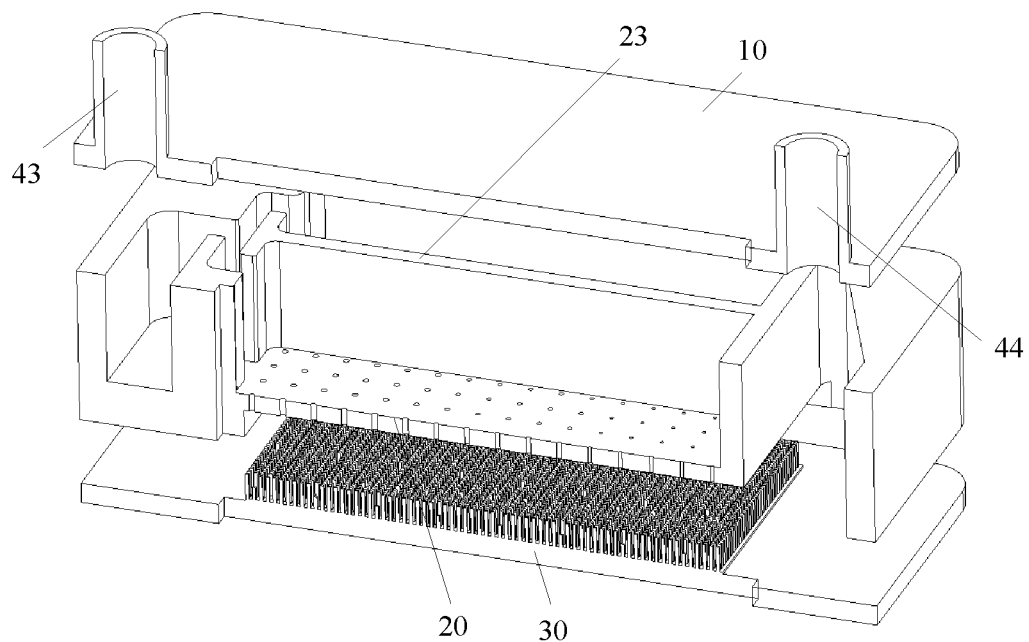
FIG. 7 is an exploded diagram of FIG. 6.
Figure 8:
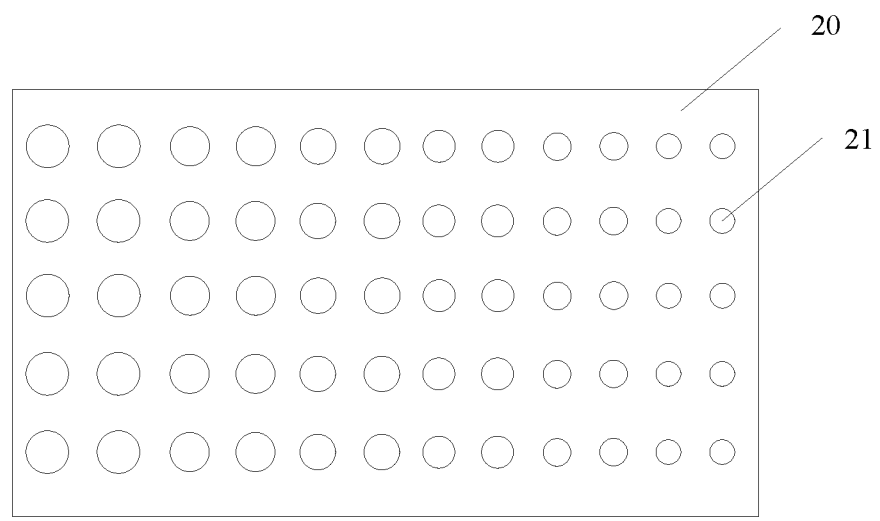
FIG. 8 is a schematic structural diagram of an orifice plate of the heat dissipator in FIG. 6.

For the single-pass heat dissipator, a flow manner of a fluid is as follows: The fluid flows in from the distribution cavity 40 and flows out of the heat exchange cavity 50. Referring to FIG. 6 to FIG. 8, the distribution cavity 40 is provided with a fluid inlet 43, and the heat exchange cavity 50 is provided with a fluid outlet 44.

A process in which heat dissipation is performed on the heat emitting apparatus by using the single-pass heat dissipator is as follows: A fluid enters the distribution cavity 40 from the fluid inlet 43, and flows through the through holes 21 under internal pressure of the distribution cavity 40 and then is jetted into the fluid passage of the heat exchange cavity 50. The fluid performs heat exchanging with the combination pin fin 62, the flow guiding pin fin 63, and the base plate 30. Under internal pressure of the heat exchange cavity 50, the fluid obtained after the heat exchanging flows out of the heat exchange cavity 50 from the fluid outlet 44 of the heat exchange cavity 50. The single-pass heat dissipator has a simple structure, and implements regular flow of a fluid.

In the single-pass heat dissipator, there is at least one fluid inlet 43, and the fluid inlet 43 may be disposed on a side surface of the distribution cavity 40. For example, it is assumed that the distribution cavity 40 includes a plurality of side surfaces. When there is one fluid inlet 43, the fluid inlet 43 is located on one side surface of the distribution cavity 40. However, when there are a plurality of fluid inlets 43, the plurality of fluid inlets 43 may be located on a same side surface of the distribution cavity 40, or may be located on different side surfaces of the distribution cavity 40.

Likewise, there is at least one fluid outlet 44, and the fluid outlet 44 may be disposed on a side surface of the heat exchange cavity 50. For example, it is assumed that the heat exchange cavity 50 includes a plurality of side surfaces. When there is one fluid outlet 44, the fluid outlet 44 is located on one side surface of the heat exchange cavity 50. However, when there are a plurality of fluid outlets 44, the plurality of fluid outlets 44 may be located on a same side surface of the heat exchange cavity 50, or may be located on different side surfaces of the heat exchange cavity 50.

When the fluid inlets 43 are located on the same side surface of the distribution cavity 40, to prevent the fluid obtained after the heat exchanging from overflowing from the through holes 21, referring to FIG. 7 and FIG. 8, diameters of through holes 21 gradually decrease in a direction from approaching the fluid inlet 43 to away from the fluid inlet 43. This is because a quantity of fluids obtained after the heat exchanging gradually increases in the heat exchange cavity 50 in the direction from approaching the fluid inlet 43 to away from the fluid inlet 43, and the diameters of the through holes 21 gradually decrease, so that the fluids obtained after the heat exchanging can be prevented from reversely overflowing to the distribution cavity 40 by using the through holes 21. A rule that a diameter decreases may be as follows: The diameter may gradually decrease from 0.8 mm to 0.5 mm and then to 0.3 mm, or may gradually decrease from 1.0 mm to 0.8 mm and then to 0.5 mm. The heat dissipator may be designed based on a requirement on internal pressure of the heat exchange cavity 50. Of course, these examples are not limited herein.

To increase entire intensity of the single-pass heat dissipator, referring to FIG. 7, a plurality of stiffeners 23 are disposed on the bottom of the distribution cavity 40.

To learn of heat dissipation performance of the heat dissipators, the heat dissipation performance of the heat dissipators is tested, and a test result is as follows:

For the distributed heat dissipator using a phase-change heat dissipation manner, the base plate 30, the combination pin fin 62, and the flow guiding pin fin 63 are all made of aluminum alloy materials, a fluid is an electronic fluorinated liquid, a quantity of fluids is 0.5 L/min, power of a chip is 300 W, and a contact area between the base plate 30 and the chip is 60 mm×60 mm. Under the foregoing condition, a thermal resistance test is performed on the distributed heat dissipator, and a thermal resistance of the distributed heat dissipator is 0.04° C./W.

For the single-pass heat dissipator using a phase-change heat dissipation manner, the base plate 30, the combination pin fin 62, and the flow guiding pin fin 63 are all made of brass materials, a fluid is an electronic fluorinated liquid, a quantity of fluids is 0.5 L/min, power of a chip is 300 W, and a contact area between the base plate 30 and the chip is 60 mm×60 mm. Under the foregoing condition, a thermal resistance test is performed on the single-pass heat dissipator, and a thermal resistance of the single-pass heat dissipator is 0.037° C./W.

It can be learned from the foregoing tests that, compared with a prior-art jet flow heat dissipator (whose thermal resistance is 0.06° C./W), the thermal resistances of the heat dissipators provided in the embodiments of this application are both less than 0.04° C./W, and heat dissipation performance is improved.

According to another aspect, an embodiment of this application provides a communications device. The communications device includes a heat emitting apparatus and the heat dissipator described above, and a base plate of the heat dissipator is in contact with the heat emitting apparatus. The heat dissipator is configured to perform heat dissipation on the heat emitting apparatus.

In the heat dissipator in the communications device provided in this embodiment of this application, there is the gap between the flow guiding pin fin and the through hole of the orifice plate, and the combination pin fin is separately in contact with the base plate and the orifice plate. Therefore, when heat dissipation is performed on the heat dissipator, after being jetted into the gap between the flow guiding pin fin and the through hole, a fluid whose temperature is less than a temperature of a heat emitting apparatus enters a fluid passage constituted by the combination pin fin and the flow guiding pin fin, to participate in heat exchanging. In this way, a quantity of fluids that directly flow out of the heat exchange cavity without passing through the fluid passage constituted by the combination pin fin and the flow guiding pin fin is reduced, and fluid utilization is increased. Therefore, the communications device provided in this embodiment of this application can improve heat dissipation efficiency of the communications device.

The objectives, technical solutions, and advantageous effects of this application are further described in detail in the foregoing specific implementations. It should be understood that the foregoing descriptions are merely specific implementations of this application, but are not intended to limit the protection scope of this application. Any modification, equivalent replacement, or improvement made based on technical solutions of this application shall fall within the protection scope of this application.

What is claimed is:

1. A heat dissipator, comprising:
a cover plate;
an orifice plate having through holes disposed thereon; and
a base plate, wherein
the cover plate, the orifice plate, and the base plate are configured to be stacked in sequence,
a distribution cavity is disposed between the orifice plate and the cover plate,
a heat exchange cavity is disposed between the orifice plate and the base plate,
the distribution cavity is configured to communicate with the heat exchange cavity by using the through holes disposed on the orifice plate, and
a plurality of pin fins facing the orifice plate are disposed on a surface of the base plate in the heat exchange cavity, gaps between the plurality of pin fins constitute a fluid passage, and the plurality of pin fins comprise:
a plurality of combination pin fins in contact with the orifice plate, and
a plurality of flow guiding pin fins associated with a through hole of the through holes and having a gap with the through hole, wherein
heights of the plurality of combination pin fins are greater than heights of the plurality of flow guiding pin fins.

2. The heat dissipator according to claim 1, wherein a difference between the heights of the plurality of combination pin fins and the heights of the plurality of flow guiding pin fins is greater than or equal to 0.1 mm.

3. The heat dissipator according to claim 1, wherein gap between a flow guiding pin fin, from the plurality of flow guiding pin fins, and the through hole is greater than or equal to 0.1 mm.

4. The heat dissipator according to claim 1, wherein an elastic gasket is disposed between a combination pin fin, from the plurality of combination pin fins, and the orifice plate, and the combination pin fin is in contact with the orifice plate by using the elastic gasket.

5. The heat dissipator according to claim 1, wherein a feature size of each combination pin fin is less than or equal to 1 mm; and
the feature size=4×an area of a cross section/a perimeter of the cross section.

6. The heat dissipator according to claim 5, wherein a ratio of a height to the feature size of each combination pin fin is greater than or equal to 5.

7. The heat dissipator according to claim 6, wherein a ratio of a gap between two adjacent combination pin fins to each of feature sizes of the plurality of combination pin fins ranges from 1:0.9 to 1:1.1.

8. The heat dissipator according to claim 1, wherein a diameter of the through holes disposed on the orifice plate ranges from 0.2 mm to 2.0 mm.

9. The heat dissipator according to claim 1, wherein partition plates facing the cover plate are disposed on a surface of the orifice plate in the distribution cavity, the partition plates are configured to partition the distribution cavity into a plurality of inflow cavities and a plurality of outflow cavities, and the plurality of inflow cavities and the plurality of outflow cavities separately communicate with the heat exchange cavity by using the through holes disposed on the orifice plate; and
the plurality of inflow cavities are provided with a fluid inlet, and the plurality of outflow cavities are provided with a fluid outlet.

10. The heat dissipator according to claim 9, wherein the plurality of inflow cavities comprises a plurality of rows of inflow cavities;
the plurality of outflow cavities comprises a plurality of rows of outflow cavities; and
the plurality of rows of the inflow cavities and the plurality of rows of the outflow cavities are alternately distributed.

11. The heat dissipator according to claim 9, wherein a diameter of a through hole of the through holes communicating with an inflow cavity, from the plurality of inflow cavities, is less than a diameter of a through hole of the through holes communicating with an outflow cavity, from the plurality of outflow cavities.

12. The heat dissipator according to claim 9, wherein diameters of through holes communicating with the plurality of outflow cavities gradually increase in a direction from approaching the fluid inlet to away from the fluid inlet.

13. The heat dissipator according to claim 9, wherein heights of first flow guiding pin fins corresponding to an inflow cavity, from the plurality of inflow cavities, is greater than heights of second flow guiding pin fins corresponding to an outflow cavity, from the plurality of outflow cavities.

14. The heat dissipator according to claim 1, wherein the distribution cavity is provided with a fluid inlet, and the heat exchange cavity is provided with a fluid outlet.

15. The heat dissipator according to claim 14, wherein diameters of through holes gradually decrease in a direction from approaching the fluid inlet to away from the fluid inlet.

16. A communications device, comprising:
a heat emitting apparatus; and
a heat dissipator, wherein
the heat dissipator comprises:
a cover plate;
an orifice plate having through holes disposed thereon; and a base plate in contact with the heat emitting apparatus, wherein
  the cover plate, the orifice plate, and the base plate are configured to be stacked in sequence,
  a distribution cavity is disposed between the orifice plate and the cover plate,
  a heat exchange cavity is disposed between the orifice plate and the base plate,
  the distribution cavity is configured to communicate with the heat exchange cavity by using the through holes disposed on the orifice plate, and
  a plurality of pin fins facing the orifice plate are disposed on a surface of the base plate in the heat exchange cavity, gaps between the plurality of pin fins constitute a fluid passage, and the plurality of pin fins comprise:
    a plurality of combination pin fins in contact with the orifice plate, and
    a plurality of flow guiding pin fins associated with a through hole of the through holes and having a gap with the through hole, wherein
  heights of the plurality of combination pin fins are greater than heights of the plurality of flow guiding pin fins.

17. The communications device according to claim 16, wherein
a difference between the heights of the plurality of combination pin fins and the heights of the plurality of flow guiding pin fins is greater than or equal to 0.1 mm.

18. The communications device according to claim 16, wherein
a gap between a flow guiding pin fin, from the plurality of flow guiding pin fins, and the through hole is greater than or equal to 0.1 mm.

19. The heat dissipator according to claim 16, wherein
partition plates facing the cover plate are disposed on a surface of the orifice plate in the distribution cavity, the partition plates are configured to partition the distribution cavity into a plurality of inflow cavities and a plurality of outflow cavities, and the plurality of inflow cavities and the plurality of outflow cavities separately communicate with the heat exchange cavity by using the through holes disposed on the orifice plate; and
the plurality of inflow cavities are provided with a fluid inlet, and the plurality of outflow cavities are provided with a fluid outlet.

20. The heat dissipator according to claim 19, wherein
the plurality of inflow cavities comprises a plurality of rows of inflow cavities;
the plurality of outflow cavities comprises a plurality of rows of outflow cavities; and
the plurality of rows of the inflow cavities and the plurality of rows of the outflow cavities are alternately distributed.

* * * * *